United States Patent [19]

Endo et al.

[11] Patent Number: 4,721,631
[45] Date of Patent: Jan. 26, 1988

[54] METHOD OF MANUFACTURING THIN-FILM ELECTROLUMINESCENT DISPLAY PANEL

[75] Inventors: Yoshihiro Endo, Nara; Takuo Yamashita, Tenri; Ikuo Ogawa, Yamatokoriyama, all of Japan

[73] Assignee: Sharp Kabushiki Kaisha, Osaka, Japan

[21] Appl. No.: 23,912

[22] Filed: Mar. 9, 1987

Related U.S. Application Data

[63] Continuation of Ser. No. 818,008, Jan. 13, 1986, abandoned.

[30] Foreign Application Priority Data

Feb. 14, 1985 [JP] Japan .................................. 60-28105
Feb. 15, 1985 [JP] Japan .................................. 60-29052

[51] Int. Cl.$^4$ .............................................. B05D 5/06
[52] U.S. Cl. .................................... 427/66; 427/70; 427/255.2; 427/255.3; 427/255.7
[58] Field of Search ............... 427/66, 255.2, 255.3, 427/255.7

[56] References Cited

U.S. PATENT DOCUMENTS 4,587,171  5/1986  Hamano ........................... 427/39 X Primary Examiner—Bernard D. Pianalto
Attorney, Agent, or Firm—Flehr, Hohbach, Test, Albritton & Herbert

[57] ABSTRACT

According to a method of this invention for manufacturing a thin-film electroluminescent display panel of the type having a pair of electrodes sandwiching a three-layer structure composed of a layer covered with dielectric layers on both sides, a silicon nitride or silicon oxynitride film is formed on a layer comprising ZnS by a plasma chemical vapor deposition method with a mixture of silicon and nitrogen gases or of silicon, nitrogen and N$_2$O gases. Alternatively, this film may be formed in a double-layer structure, the second layer being formed with a mixture of silicon and ammonia gases or of silicon, ammonia and N$_2$O gases. A dielectric layer thus formed by a method embodying this invention can satisfactorily cover the protrusions and impurities in the layer underneath and thin-film electroluminescent elements manufactured by this method have superior brightness characteristics.

20 Claims, 5 Drawing Figures

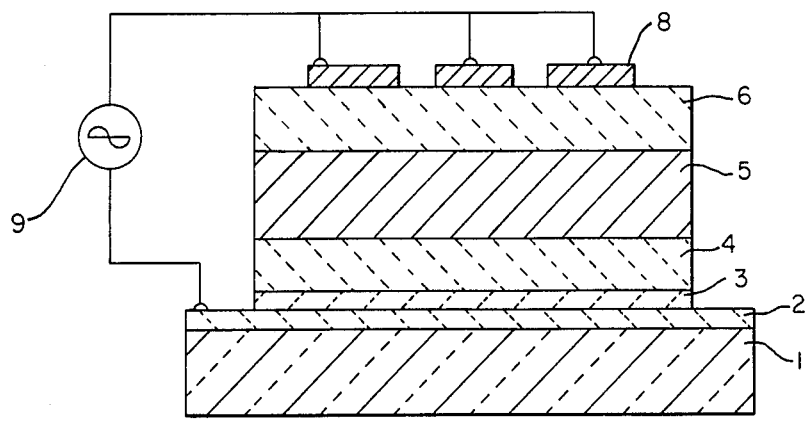
FIG.—1
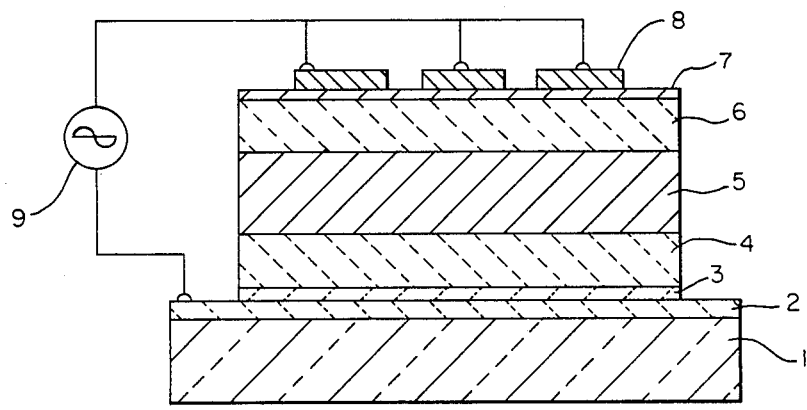
FIG.—2
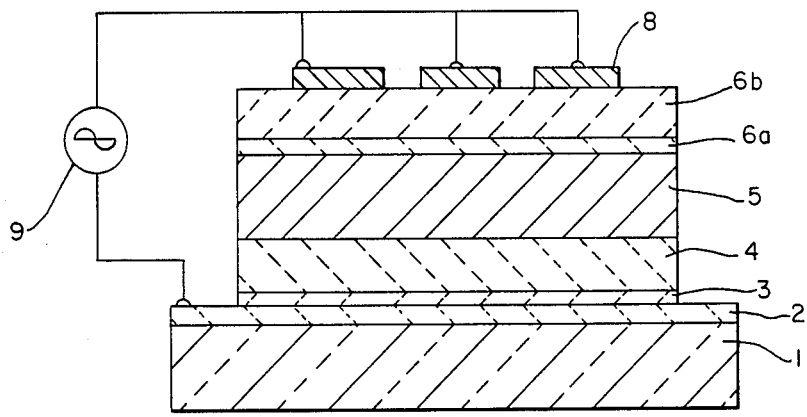
FIG.—3

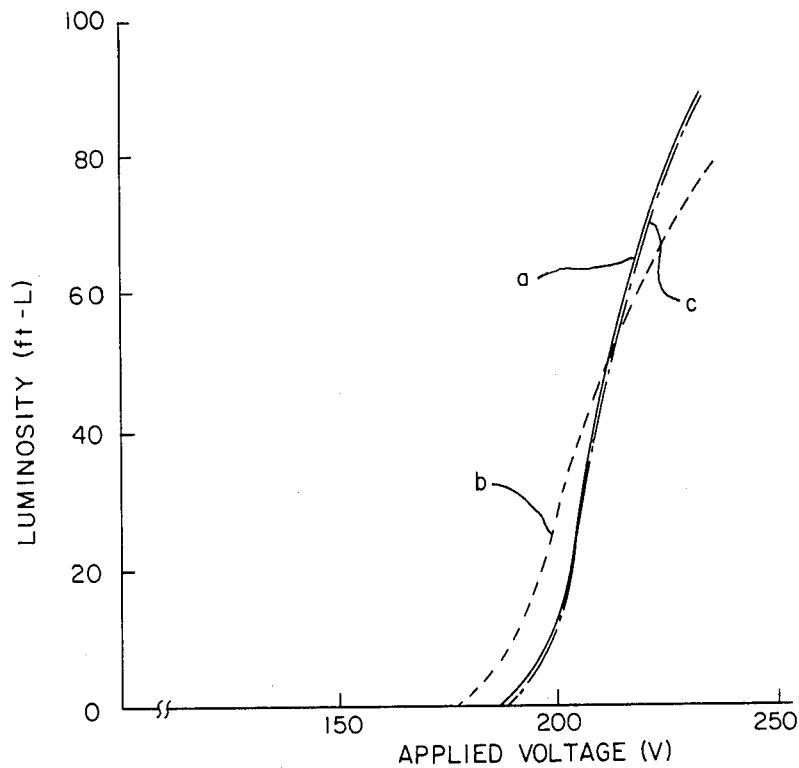
FIG.—4
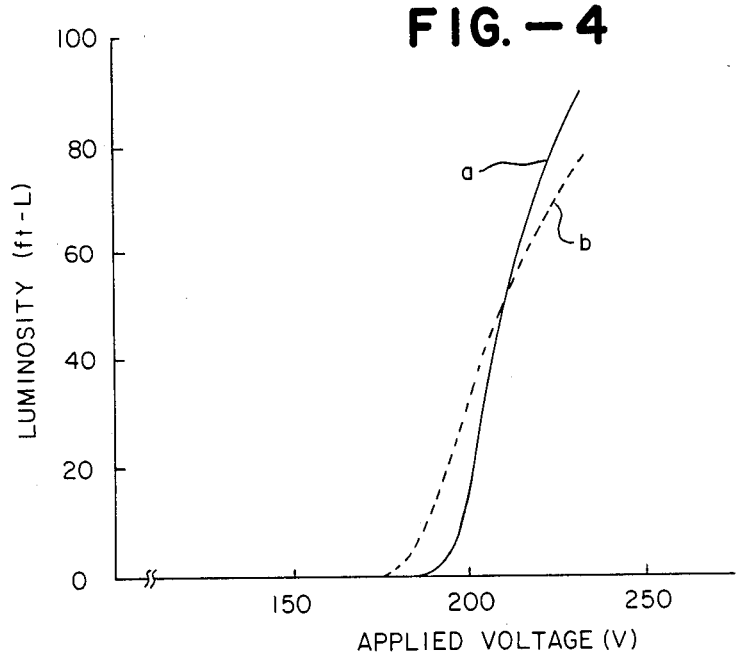
FIG.—5

METHOD OF MANUFACTURING THIN-FILM ELECTROLUMINESCENT DISPLAY PANEL

This is a continuation, of application Ser. No. 818,008 filed Jan. 13, 1986, abandoned.

This invention relates to the technology for manufacturing thin-film electroluminescent display panels and in particular to a method of manufacturing a thin-film electroluminescent display panel which comprises a three-layer structure having the two principal surfaces of a thin-film luminescent layer covered by dielectric layers and a pair of electrodes sandwiching this three-layer structure such that electroluminescence is obtained in response to an input of an AC electric field.

Three-layer thin-film electroluminescent display panels comprising a thin-film electroluminescent layer sandwiched between dielectric layers are widely used for their high brightness characteristics in various display devices and as surface light sources. Two examples of the basic structure of such a three-layer thin-film electroluminescent element are shown in FIGS. 1 and 2 wherein corresponding components are indicated by the same numerals. Reference being made to FIGS. 1 and 2 simultaneously for convenience, a transparent substrate 1, for example, of glass has thereon a plurality of transparent electrodes 2 in the form of parallel stripes. Thereabove is a three-layer structure composed successively of a lower dielectric layer comprising a $SiO_2$ film 3 and a silicon nitride ($Si_3N_4$) or silicon oxynitride film 4, a luminescent layer 5 of ZnS doped with an active material such as Mn and an upper dielectric layer which is a silicon nitride or silicon oxynitride film 6 in the example shown in FIG. 1 and a superposition of a silicon nitride or silicon oxynitride film 6 and an $Al_2O_3$ film 7 in the example shown in FIG. 2. Above the upper dielectric layer, that is, above the silicon nitride or silicon oxynitride film 6 of FIG. 1 or the $Al_2O_3$ film 7 of FIG. 2, there are stripes of back electrodes 8 in a perpendicular relationship to the transparent electrodes 2. The back electrodes 8 and the transparent electrodes 2 are connected to an AC power source 9 for driving this thin-film electroluminescent display element.

Regarding the examples described above, the upper dielectric layer is made of a silicon nitride or silicon oxynitride film known to be an amorphous insulative film or a composite film of silicon nitride or silicon oxynitride and $Al_2O_3$ because of their high breakdown voltage. Silicon nitride films are usually formed by sputtering a silicon target with nitrogen gas but silicon nitride films thus formed have the following general disadvantages:

(1) They do not cover small protrusions and impurities on the luminescent layer very well;

(2) The luminescent layer is damaged easily by the incidence of secondary electrons at the time of sputterings and this affects its luminescent characteristics; and (3) The rate of its formation is about 200 A/min, which is rather slow, and the equipment cost is high because a high level of vacuum is required.

The first of the above disadvantages is related to the problem of humidity invading the boundary surface between the luminescent layer and the silicon nitride film and hence causing these layers to become separated. The second makes it difficult to use the product as a display device and the third makes it difficult to mass-produce the products.

A silicon nitride and silicon oxynitride film can be formed not only by sputtering but also by a plasma chemical vapor deposition method. When a plasma chemical vapor deposition method is used, a mixture of silane and ammonia gases is usually used as the source gas and nitrogen gas may be added thereto as a carrier. If $N_2O$ is further added to the source gas, a silicon oxynitride film can be formed. A silicon nitride film thus obtained can cover small protrusions and impurities on the luminescent layer, there is no problem of secondary electrons, and the rate of film formation is faster than by sputtering. On the other hand, however, the amount of hydrogen contained in a mixture of silane and ammonia gases is large and the generated silicon nitride or silicon oxynitride film contains hydrides like $SiH_n$ and $NH_n$. Moreover, a large amount of hydrogen radicals are generated in the plasma and such hydrogen radicals tend to damage the luminescent layer underneath. In other words, hydrogen radicals interact with ZnS in the luminescent layer so that sulfur is removed in the form of $H_2S$ from the surface of the luminescent layer, forming the so-called "S-vacancies". As a result, if a silicon nitride film formed by a plasma chemical vapor deposition method is used as the upper dielectric layer of a thin-film electroluminescent display panel, its brightness is likely to be adversely affected.

It is therefore an object of the present invention to provide a method of manufacturing a thin-film electroluminescent element with improved anti-humidity, mass production and brightness characteristics.

The above and other objects of the present invention are attained by generating a silicon nitride film by a plasma chemical vapor deposition method with a mixture of silane and nitrogen gases. This layer is generated to cover a luminescent layer underneath and another silicon nitride film may be generated superposingly thereabove by using a mixture of silane and ammonia gases by another plasma chemical vapor deposition process.

The accompanying drawings, which are incorporated in and form a part of the specification illustrate embodiments of the present invention and, together with the description, serve to explain the principles of the invention.

BRIEF DESCRIPTION OF THE DRAWING

FIG. 1 is a cross-sectional view which schematically shows the basic structure of a thin-film electroluminescent display panel which can be manufactured by a method of the present invention.

FIG. 2 is a cross-sectional view which schematically shows the basic structure of a prior art thin-film electroluminescent display panel.

FIG. 3 is a cross-sectional view which schematically shows the basic structure of a thin-film electroluminescent display panel which can be manufactured by another method embodying the present invention.

FIGS. 4 and 5 show the relationship between applied voltage and brightness of thin-film electroluminescent display panels manufactured by methods embodying the present invention and by a prior art method.

DETAILED DESCRIPTION OF THE DRAWING

A method embodying the present invention is described firstly with reference to FIG. 1. After a transparent electrically conductive film of indium tin oxide (ITO) is deposited on a glass substrate 1, a plurality of transparent electrodes 2 are formed therefrom as parallel stripes. Next, a SiO$_2$ film 3 of thickness about 200–800 A is formed by a sputtering method or a vacuum deposition method. A silicon nitride film 4 of thickness about 1000–3000 A is further formed thereon by a sputtering method to complete a lower dielectric layer. The purpose of this SiO$_2$ film 3 is to make a firm connection between the lower dielectric layer and the transparent electrode 2.

A luminescent layer 5 is thereafter formed on the silicon nitride film 4 by electron beam evaporation of sintered pellets with Mn, Dy, Tm or their compound added to ZnS to serve as light-emitting centers. Its thickness is about 6000–8000 A and it is annealed in vacuum after its formation. Thereafter, this luminescent layer is treated as a base layer and an upper dielectric layer consisting of a silicon nitride film 6 is superposingly formed thereon with a thickness of about 1500–3000 A. A three-layer structure with upper and lower dielectric layers sandwiching a luminescent layer on its two principal surfaces is thus completed. FIG. 3 is a cross-sectional view schematically showing the basic structure of a thin-film electroluminescent display panel manufactured by another method according to the present invention. This method is different from the one described by way of FIG. 1 above only in that the upper dielectric layer consists of two silicon nitride films 6a and 6b as shown in FIG. 3 instead of only one such film (6 of FIG. 1).

Both the silicon nitride film 6 of FIG. 1 forming the upper dielectric layer according to the first embodiment and the first silicon nitride film 6a of FIG. 3 on the side proximal to the luminescent layer 5 are formed by a plasma chemical vapor deposition method with a mixture of silane and nitrogen gases. In this situation, since silane is the only source of hydrogen in the gas, the amount of hydrogen radicals generated in the plasma is moderate unlike when a mixture of silane and ammonia gases is used as conventionally done so that damage to the surface of the luminescent layer 5 of ZnS is suppressed and hence that the brightness of the luminescent layer 5 is not adversely affected significantly. It has been ascertained experimentally that silicon nitride films thus formed by a plasma chemical vapor deposition method with a mixture of silane and nitrogen gases also demonstrate a superior ability to cover small protrusions and impurities underneath and hence serve well as humidity-resistant protective layers. These layers can be formed at a rate of about 200–300 A/min which is faster than the speed by a sputtering method. This rate can be made still faster by improving the apparatus and changing the conditions. Since the binding energy of N$_2$ is greater than that between N and H in NH$_3$ and dissociation of N$_2$ is less likely to occur than that of NH$_3$, however, there is a limit to the rate at which a silicon nitride film can be formed. According to a method embodying the present invention, therefore, the first silicon nitride film 6a of FIG. 2 is formed to a thickness of about 100–800 A by a plasma chemical vapor deposition method with a mixture of silane and nitrogen gases and then the second silicon nitride film 6b of FIG. 2 is formed thereon by a plasma chemical vapor deposition method with a mixture of silane and ammonia gases at a rate of about 300–600 A/min so that the total thickness of the upper dielectric layer will be about 1500–3000 A. Since it is the boundary condition between the luminescent layer 5 and the first silicon nitride film 6a that is the most important factor regarding the brightness characteristics, a thickness of about 100–800 A is sufficient for the proximal silicon nitride film 6a formed with a mixture of silane and nitrogen gases. The distal silicon nitride film 6b is superposed thereon at a faster rate with a mixture of silane and ammonia gases. The same plasma chemical vapor deposition apparatus may be used to form the two silicon nitride films 6a and 6b of FIG. 3 merely by changing the composition of the gas mixture between the two films.

Since defects are few either in the silicon nitride film 6 of FIG. 1 or in the double silicon nitride films 6a and 6b of FIG. 3, back electrodes 8 of aluminum or the like can be directly formed thereon according to a pattern without the need to first superpose thereon a metal oxide layer, for example, of Al$_2$O$_3$. After a metallic layer of Al or the like is formed, the back electrodes 8 are made in the form of stripes oriented perpendicularly to the directions of the transparent electrodes 2 such that a matrix of electrodes is formed. The back electrodes 8 and the transparent electrodes 2 are connected to an AC power source 9 to apply an AC electric field to the luminescent layer 5 to cause electroluminescence in response to the applied field.

FIGS. 4 and 5 show the relationship between applied voltage and luminosity of various thin-film electroluminescent display panels for the purpose of comparison. Curve a in FIG. 4 is for a panel of FIG. 1 with the silicon nitride film 6 formed by a plasma chemical vapor deposition method with a mixture of silane and nitrogen gases according to the first embodiment described above. Curve b in FIG. 4 is for a panel of FIG. 1 with the silicon nitride film 6 formed instead by a plasma chemical vapor deposition method with a mixture of silane and ammonia gases. Curve c in FIG. 4 is for a similar panel with the silicon nitride film 6 formed by a sputtering method. The other layers of these three sample panels were manufactured under completely identical conditions and they were all driven for the testing by a symmetrically pulsed AC electric field of 100 Hz and $40^3$. FIG. 4 shows that the panel manufactured according to a method of this invention has about the same brightness characteristics as the panel with the silicon nitride film 6 formed by sputtering and is far superior to the one with the corresponding film formed by a plasma chemical vapor deposition method with a mixture of silane and ammonia gases.

In FIG. 5, Curve a is for a panel of FIG. 3 with the first silicon nitride film 6a of the upper dielectric layer formed by a plasma chemical vapor deposition method with a mixture of silane and nitrogen gases and the second silicon nitride film 6b subsequently thereon by a plasma chemical vapor deposition method with a mixture of silane and ammonia gases according to the second embodiment of the present invention described above. The other layers of this panel were manufactured and the panel thus completed was driven also under the same conditions as the panels considered by way of FIG. 4. Curve b in FIG. 5 is the same as Curve b in FIG. 4 and is shown here again for the purpose of comparison. FIG. 5 also shows that Curve a for the panel manufactured by a method embodying the present invention exhibits superior brightness characteristics than Curve b for an panel manufactured for comparison by a conventional method.

With respect to both embodiments of the present invention described above, N$_2$O may be introduced into the silicon nitride film formed by a plasma chemical vapor deposition method such that an upper dielectric layer consisting of silicon oxynitride is obtained with similar effects. With respect to both embodiments of the present invention described above, furthermore, the lower dielectric layer may be understood to be manufactured by a conventional method. The conditions of the plasma chemical vapor deposition method for the upper dielectric layer are: Substrate temperature about 100°–300° C. for both films 6a and 6b, gas pressure about 0.2–2.0 torr, and a carrier gas of $N_2$ or Ar to be introduced whenever necessary into a mixture of silane and ammonia gases.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the silicon nitride films manufactured by the methods of the present invention can be replaced by a silicon oxynitride layer formed by introducing $N_2O$ into the gas mixture (silane and nitrogen or silane and ammonia) used in a plasma chemical vapor deposition method. Such modifications and variations that may be apparent to a person skilled in the art are intended to be included within the scope of this invention.

What is claimed is:

1. In a method of manufacturing a thin-film electroluminescent display panel which comprises a structure including a luminescent layer with characteristics of electroluminescence in response to an applied electric field and dielectric layers covering said luminescent layer and a pair of electrodes sandwiching said structure, step of forming a silicon nitride film over a luminescent layer by a plasma chemical vapor deposition method with an ammonium-free mixture of silane and nitrogen gases.

2. The method of claim 1 further comprising step of forming aluminum electrodes on said silicon nitride film.

3. The method of claim 1 wherein said luminescent layer is made of an ZnS material doped with an active substance.

4. In a method of manufacturing a thin-film electroluminescent display panel which comprises a structure including a luminescent layer with characteristics of electroluminescence in response to an applied electric field and dielectric layers covering said luminescent layer and a pair of electrodes sandwiching said structure, step of forming a silicon oxynitride film over a luminescent layer by a plasma chemical vapor deposition method with an ammonium-free mixture of silane, nitrogen and $N_2O$ gases.

5. The method of claim 4 further comprising step of forming aluminum electrodes on said silicon oxynitride layer.

6. The method of claim 4 wherein said luminescent layer is made of a ZnS material doped with an active substance.

7. In a method of manufacturing a thin-film electroluminescent display panel which comprises a structure including a luminescent layer with characteristics of electroluminescence in response to an applied electric field and dielectric layers covering said luminescent layer and a pair of electrodes sandwiching said structure, steps of forming a first silicon nitride film by a plasma chemical vapor deposition method with an ammonium-free mixture of silane and nitrogen gases over a luminescent layer and forming a second silicon nitride film by a plasma chemical vapor deposition method with a mixture of silane and ammonia gases over said first silicon nitride film.

8. The method of claim 7 wherein said first silicon nitride film is about 100–800 A in tickness and the total thickness of said first and second silicon nitride films is about 1500–3000 A.

9. The method of claim 7 further comprising the step of forming aluminum electrodes on said second silicon nitride film.

10. The method of claim 7 wherein said first and second silicon nitride films are formed at temperature about 100°–300° C. and gas pressure about 0.2–2.0 torr.

11. The method of claim 7 wherein said luminescent layer is made of a ZnS material doped with an active substance.

12. In a method of manufacturing a thin-film electroluminescent display panel which comprises a structure including a luminescent layer with characteristics of electroluminescence in response to an applied electric field and dielectric layers covering said luminescent layer and a pair of electrodes sandwiching said structure, steps of forming a first silicone oxynitride film by a plasma chemical vapor deposition method with a mixture of silane, nitrogen and $N_2O$ gases over a luminescent layer and forming a second silicone oxynitride film by a plasma chemical vapor deposition method with a mixture of silane, ammonia and $N_2O$ gases over said first silicone oxynitride film.

13. The method of claim 12 wherein said first silicon oxynitride film is about 100–800 A in thickness and the total thickness of said first and second silicon oxynitride films is about 1500–3000 A.

14. The method of claim 12 further comprising the step of forming aluminum electrodes on said second silicon oxynitride film.

15. The method of claim 12 wherein said first and second silicon oxynitride films are formed at temperature about 100°–300° C. and gas pressure about 0.2–2.0 torr.

16. The method of claim 12 wherein said luminescent layer is made of a ZnS material doped with an active substance.

17. The method of claim 1 wherein said ammonium-free mixture is exclusive of any hydrogen-containing compound except said silane gas.

18. The method of claim 4 wherein said ammonium-free mixture is exclusive of any hydrogen-containing compound except said silane gas.

19. The method of claim 7 wherein said ammonium-free mixture is exclusive of any hydrogen-containing compound except said silane gas.

20. The method of claim 12 wherein said ammonium-free mixture is exclusive of any hydrogen-containing compound except said silane gas.

* * * * *

UNITED STATES PATENT AND TRADEMARK OFFICE
CERTIFICATE OF CORRECTION

PATENT NO. : 4,721,631
DATED : January 26, 1988
INVENTOR(S) : Yoshihiro Endo, et al.

It is certified that error appears in the above—identified patent and that said Letters Patent is hereby corrected as shown below:

FIGS. 4 and 5, change "LUMINOSITY" to --BRIGHTNESS--.

Column 1, about line 22, change "element" to --display panel--.

Column 1, about line 43, change "element" to --panel--.

Column 4, about line 24, change "luminosity" to --brightness--.

Column 4, about line 39, change "$40^3$" to --pulse width 40μsec--.

Column 6, about line 10, change "tickness" to --thickness--.

Signed and Sealed this

Ninth Day of August, 1988

*Attest:*

DONALD J. QUIGG

*Attesting Officer*   *Commissioner of Patents and Trademarks*